March 19, 1968 — R. R. BOWER — 3,374,305

ELECTRIC CIRCUIT

Filed March 21, 1966 — 2 Sheets-Sheet 1

INVENTOR.
RICHARD R. BOWER
BY
Christie, Parker & Hale
ATTORNEYS

March 19, 1968 R. R. BOWER 3,374,305

ELECTRIC CIRCUIT

Filed March 21, 1966 2 Sheets-Sheet 2

INVENTOR.
RICHARD R. BOWER

BY

Christie, Parker & Hale
ATTORNEYS

United States Patent Office 3,374,305
Patented Mar. 19, 1968

3,374,305
ELECTRIC CIRCUIT
Richard R. Bower, 10012 Wilbur Ave., Northridge, Calif. 91324
Filed Mar. 21, 1966, Ser. No. 536,015
10 Claims. (Cl. 174—68.5)

ABSTRACT OF THE DISCLOSURE

A series of elongated electrical conductors is disposed in intersecting grooves in a sheet or a board. Each conductor includes a shank to form a T-shaped cross section providing outwardly-extending portions of the conductor on opposite sides of the shank and disposed in a respective groove. The shanks extend into the board or support to anchor the conductors in place. The ends of the conductors are in electrical contact with each other to form an electrical circuit.

This invention relates to electrical circuits, and supports for them.

At the present time, printed circuit techniques are widely used to produce circuits automatically. In a typical printed circuit, a board of electrical insulating material is coated on at least one side with a thin film of copper. Thereafter, the copper coating is covered with a photosensitive material which can be made less soluble by exposure to light. An image of the circuit is projected on the photosensitive material. The more soluble, unexposed material is dissolved, and the exposed copper etched away to leave the desired printed circuit on the board. The less soluble photosensitive material is then removed from the remaining copper. Holes are drilled through the board at appropriate places, and electrical components are secured to the opposite side of the board and connected through the openings to the appropriate points of the printed circuit.

In addition to being time-consuming and expensive because of the photographic technique required and the etching away of large amounts of unused copper, conventionally-produced printed circuits are expensive because they require a draftsman to lay out the circuit on a rather large sheet which is thereafter photographed and reduced in size to provide a negative which casts the image on the photosensitive coating. Printed circuits also have the disadvantage of low electrical conductivity because the copper coating is very thin. This increases the heat loss in the circuit, which is further aggravated by the poor thermal conductivity of the thin strips of copper in the circuit. The printed circuits also lack mechanical strength because the copper strips are so thin, and are easily damaged if the board is bent or jarred.

This invention provides a circuit which can be automatically assembled quickly and inexpensively by mounting on a support conductors which have good electrical and thermal conductivity.

In one form of the invention, the electrical circuit includes a sheet and a series of electrically-conductive rivets mounted in the sheet. Each rivet has a head adjacent the head of an adjacent rivet in the series, and means are provided for electrically connecting adjacent portions of the heads so the series of rivets forms an electrically-conductive path on the sheet.

The adjacent portions of the rivet heads can be soldered together, or the adjacent portions can overlap and be spot-welded together.

Each rivet has at least one shank which extends down into the sheet to anchor the rivet to the sheet. In the presently-preferred embodiment, each rivet carries a pair of spaced shanks which extend down into the sheet, and the rivet is T-shaped in cross section where the shank and head join.

In the embodiment of the invention where the adjacent portions of adjacent heads overlap, the heads are preferably beveled so that the adjacent portions fit together to present a smooth surface along the electrically-conductive path on the sheet.

In the presently-preferred circuit of this invention, a sheet or a support has opposed surfaces. A first set of grooves in one of the surfaces extend in the same general direction. A second set of grooves in the same surface extend transverse to the first set of grooves to intersect them at a plurality of locations. A series of elongated electrical conductors are disposed in the grooves with the adjacent ends of the conductors in electrical contact with each other. At least one shank on each of the conductors extends into the support to anchor the conductors in place. A separate annular conductive eyelet is disposed in at least some of the holes, and each eyelet is in electrical contact with at least some of the conductors. Electrical components are disposed on the side of the support opposite from the grooves, and electrical leads from the components extend through respective eyelets and are electrically connected to them.

These and other aspects of the invention will be more fully understood from the following detailed description and the accompanying drawings, in which.

Figure 1:
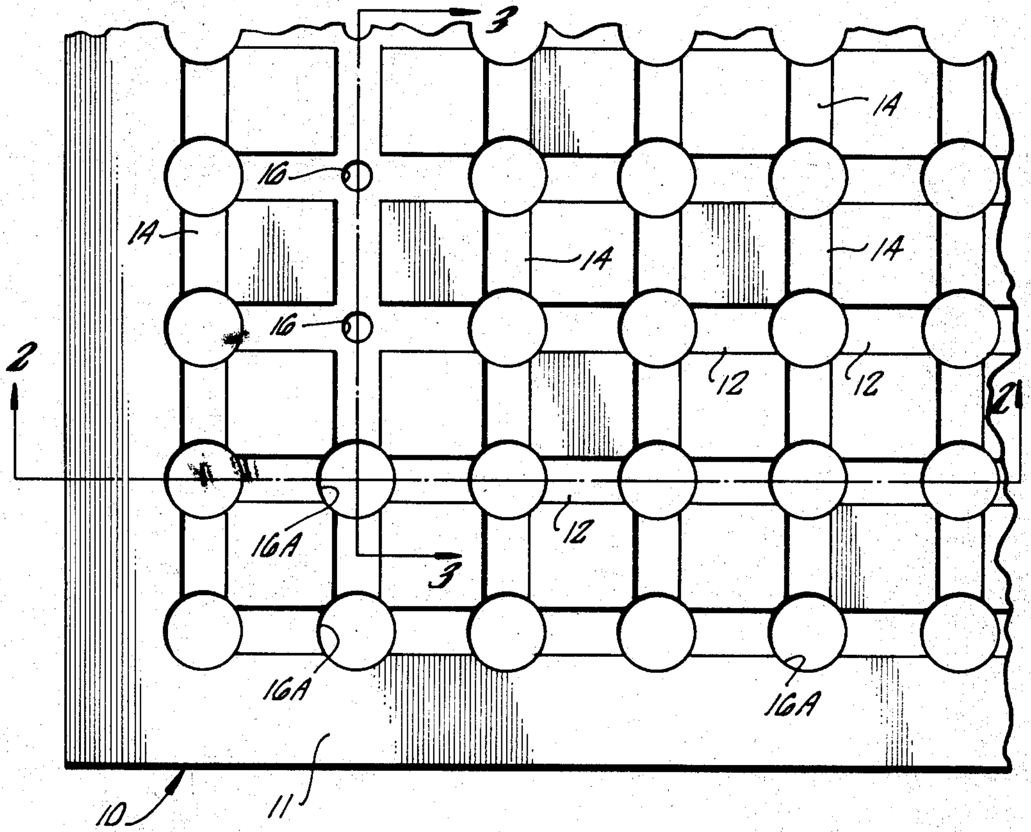
FIG. 1 is a plan view of the presently-preferred support for the electrical circuit.
Figure 2:
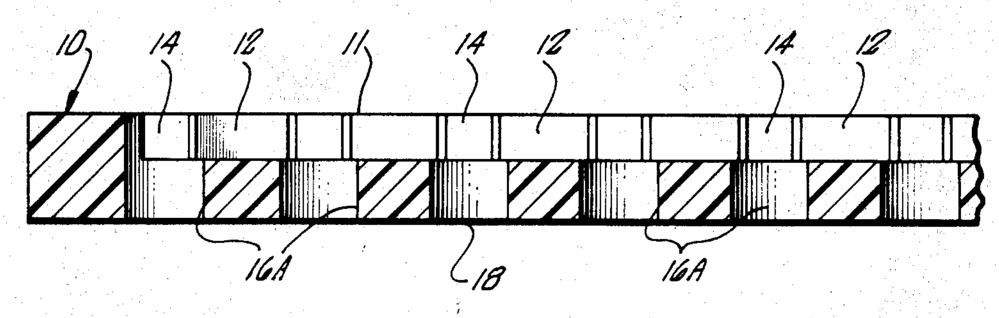
FIG. 2 is a view taken on line 2—2 of FIG. 1.

Referring to FIGS. 1 and 2, a flat plate or board 10 of electrical insulating material, such as plastic, has a top surface 11 with a first set of parallel grooves 12 extending across it from left to right (as viewed in FIG. 1). A second set of parallel grooves 14 in the top surface of the board extend from top to bottom (as viewed in FIG. 1) to intersect the grooves of the first set.

Holes 16 extend through the board from the top surface 11 to a bottom surface 18 at various locations where the grooves in the first and second sets intersect. A separate annular eyelet 22 (FIG. 3) of electrically-conductive material is fitted into certain ones of the holes 16A through the board. These holes 16A are larger than the other holes. As shown best in FIG. 3, the exterior of the eyelet makes a snug fit within its respective hole, and each eyelet has at its lower end an outwardly-extending flange 24 which rests against the shoulder in the hole. The length of the eyelet is slightly greater than that of the hole so that each end of the eyelet is exposed above the adjacent part of the board to facilitate electrical connections as described in detail below.

Figure 3:
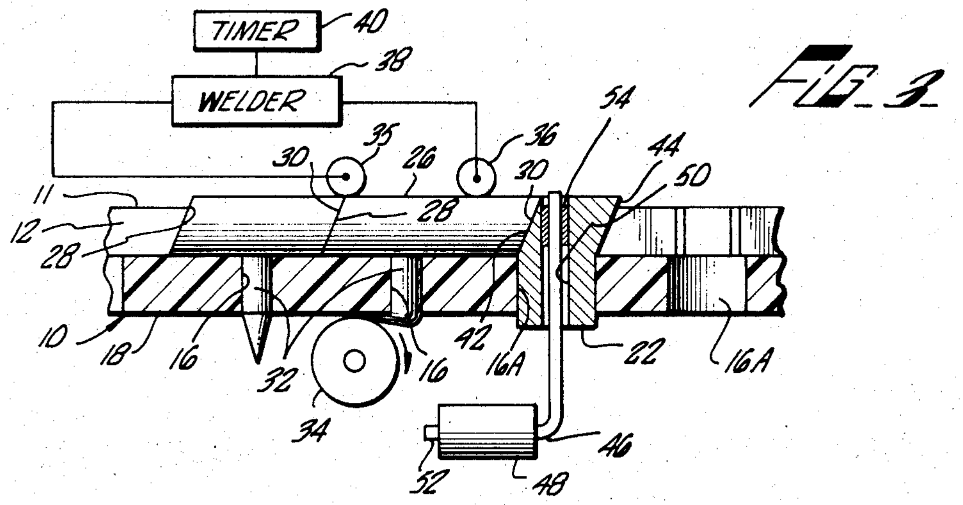
FIG. 3 is a sectional elevation of an electrical circuit of this invention.

Referring to FIG. 3, a series of elongated electrical conductors or wires 26 are disposed in a groove in the top surface, say, a groove 12 which extends from left to right. Each end of each electrical conductor is beveled along an inclined plane which is perpendicular to the plane of FIG. 3, and which extends upwardly and to the right (as viewed in FIG. 3). Thus, the left (as viewed in FIG. 3) end 28 of each electrical conductor has a sloping surface which extends upwardly to the right and faces away from the support. The right (as viewed in FIG. 3) end of each conductor has a flat surface 30 which extends upwardly and to the right to face downwardly against an opposing surface 28 on the left end of the adjacent conductor. Thus, adjacent ends of conductors overlap but their top surfaces form a smooth joint. Each conductor has a downwardly-extending shank 32 which makes a snug friction fit in a respective hole 16 in the board. The electrical conductors are easily inserted in the position shown in FIG. 3 automatically by a machine (not shown) designed for that purpose. Preferably, the lower ends of the shanks project a short distance beyond the bottom surface 18 of the board so they can be bent over and mechanically lock the electrical conductors to the board. This is easily accomplished automatically by passing the board and conductors between a squeeze roller 34 mounted under the board to roll against the bottom surface of the board with sufficient force to deform the lower ends of the shanks. A pair of horizontally-spaced welding rollers 35 and 36 make contact with the top surfaces of the conductors and are supplied welding current from a welder 38 which is actuated at appropriate intervals by a timer 40. As shown in FIG. 3, the board moves from left to right between the squeeze and welding rollers. The vertical (as viewed in FIG. 3) dimension of the conductors is such that the top surface of the conductor projects slightly above the top surface 11 of the board so that there can be good contact between the welding rollers and the conductors. The timer turns on the welder just as welding roller 35 passes the point between adjacent ends of adjacent electrical conductors. This spot-welds the ends together. Each of the rollers is spring loaded by conventional mountings (not shown) to be yieldingly urged toward the board. As shown best in FIG. 3, the upper end of each eyelet (when an eyelet is used) is beveled to match adjacent surfaces of the adjacent ends of the conductors. Thus, the eyelet shown in FIG. 3 has an upwardly-facing surface 42 which extends upwardly to the right to lie against the downwardly-facing surface 30 on the end of the electrical conductor to the left of the eyelet. The right side of the eyelet has a downwardly-facing surface 44 which extends upwardly to the right to fit against opposed surface 28 of the adjacent end of the conductor to the right of the eyelet. The eyelet can be put in the position shown automatically. It is prevented from slipping through the hole in which it is placed by the surface 44 coming to rest on the adjacent conductor. The eyelet is spot-welded to the adjacent ends of the conductors as just described. After the eyelet and appropriate conductors are in place, an electrical lead 46 of an electrical component 48 on the side of the board opposite from the grooves is disposed through the central opening 50 in the eyelet and bent over to lie in a groove (not shown) intersecting the groove 12 in which the electrical conductors are mounted. Another electrical lead 52 extending from the opposite side of the component is similarly disposed in another eyelet (not shown). Additional wires, eyelets, and components (not shown) are mounted as just described to provide a complete circuit.

The electrical conductors, the eyelets, and the electrical leads from the electrical components are subject to tinning, i.e., they will coat with solder when exposed to molten solder. The electrical leads are subsequently electrically bonded to the eyelets by floating the circuit board in a pool of molten solder. This tins the exposed conductors, eyelets, and electrical leads, and bonds the leads to the eyelets with a layer of solder 54.

Figure 4:
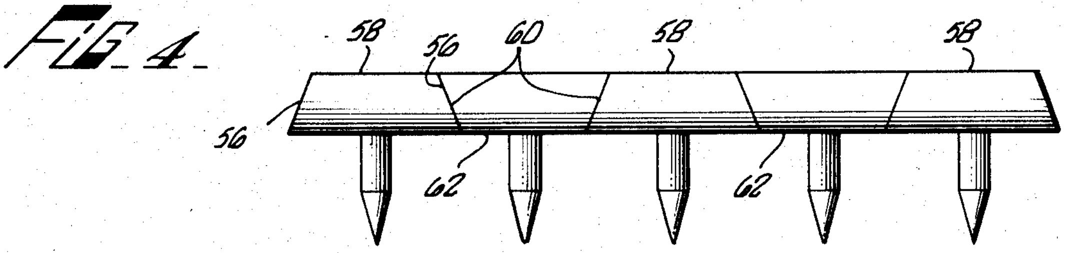
FIG. 4 is a schematic elevation showing an alternate arrangement of how adjacent portions of electrical conductors can fit together.

FIG. 4 shows an alternate arrangement of the ends of the electrical conductors 26. In this case, the sloping surfaces 56 at the ends of every other conductor 58 face upwardly, and the sloping surfaces 60 of the alternate conductors 62 face downwardly. The advantage of this arrangement is that each conductor is symmetrical. However, the conductors have to be set in place alternately from a separate, respective supply to provide the matched fit shown in FIG. 4. Except for these distinctions, the method of assembling and the final result is identical with that described for the circuit of that shown in FIG. 3.

Figure 5:
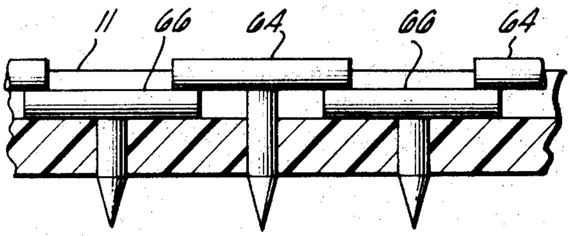
FIG. 5 is a schematic elevation showing how adjacent portions of electrical conductors can fit together in a staggered overlapping arrangement.

In the arrangement shown in FIG. 5, conductors in series are identical in construction and their ends are not beveled. However, they are spaced apart by distances slightly less than the over-all length of each individual conductor. Every other conductor 64 is arranged so that its ends rest on adjacent ends of alternate conductors 66. With this arrangement, the vertical dimension of the conductors need not be greater than the depth of the groove in the top surface 11 of the board. In fact, it can be slightly less as long as the groove depth is not more than twice the vertical dimension of the conductors so that the conductors which rest on top of other conductors have top surfaces which project slightly above the top surface 11 of the board.

Figure 6:
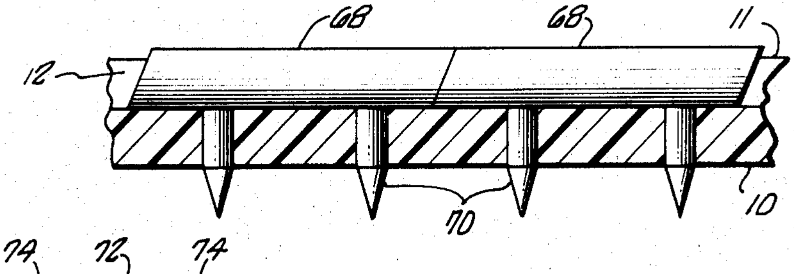
FIG. 6 is a schematic sectional elevation of electrical conductors having a pair of spaced shanks each.

The arrangement shown in FIG. 6 uses conductors 68 identical with those shown in FIG. 3. However, each conductor has a pair of longitudinally-spaced shanks 70 which permit the conductors to be of greater length and still be accurately positioned and firmly locked in the board.

Figure 7:
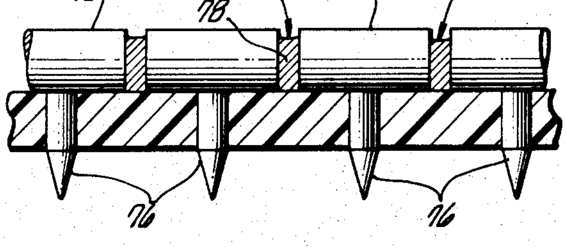
FIG. 7 is a schematic elevation showing yet another arrangement for mounting the electrical conductors on a support.

In the embodiment shown in FIG. 7, adjacent ends of adjacent conductors 72 do not quite touch so that there is a space 74 between them. A separate shank 76 on each conductor firmly holds it in place. The conductors are put into electrical contact with each other by deposition of solder 78 in the space 74. This is done most conveniently by floating the board in a molten pool of solder (not shown) with the surface which carries the conductors in contact with the solder. The electrical conductors, which conveniently can be made of copper, easily tin and, therefore, are coated with solder. Capillary action draws solder into the space 74 between adjacent ends of the conductors. The advantage of this arrangement is that conductors can be symmetrical, and do not require a welding operation.

Although the conductors have been described as being deposited only in the grooves 12 which run from left to right (as viewed in FIG. 1), identical components or procedures can be used to deposit conductors in the vertical grooves which cross the horizontal grooves. In this way, circuits of any desired degree of complexity can be constructed.

I claim:

1. An electrical circuit comprising a support having opposed surfaces, a first set of grooves in one surface and extending in the same general direction, a second set of grooves in the said one surface extending transverse to the first set of grooves to intersect them at a plurality of locations, a series of elongated electrical conductors disposed in the grooves with adjacent ends of the conductors in electrical contact with each other, and at least one shank on each of the conductors extending into the support to anchor the conductors in place, each conductor and shank forming a T-shaped cross section providing outwardly-extending portions of the conductor on opposite sides of the shank.

2. An electrical circuit according to claim 1 in which each elongated electrical conductor has a pair of longitudinally-spaced shanks extending into the support.

3. An electrical circuit according to claim 2 in which each shank forms with its respective conductor a T-shaped cross section providing outwardly-extending portions of the conductor on opposite sides of each shank.

4. An electrical circuit according to claim 1 in which adjacent ends of the adjacent conductors are spaced from each other, and means electrically bonding together adjacent ends of the conductors.

5. An electrical circuit according to claim 1 in which the ends of each electrical conductor are beveled to make a smooth fit together.

6. An electrical circuit according to claim 1 in which one end of each electrical conductor is beveled to provide a sloping surface facing away from the support, and the other end is beveled to provide a sloping surface facing toward the support.

7. An electrical circuit according to claim 1 in which every other elongated electrical conductor in the series has its ends beveled to provide a downwardly-facing sloping surface, and alternate elongated electrical conductors in the series have their ends beveled to provide sloping upwardly-facing surfaces.

8. An electrical circuit according to claim 1 in which the shanks extend into the support and are displaced laterally to lock the electrical conductors to the support.

9. An electrical circuit comprising a sheet, a series of electrically-conductive members mounted in the sheet, each member having a head adjacent the head of an adjacent member in the series, the heads of adjacent members being disposed in overlapping relation to form an electrically-conductive path on the sheet.

10. An electrical circuit according to claim 9 in which the members in the series are arranged with every other head resting on an adjacent head.

References Cited

UNITED STATES PATENTS

| | | | |
|---|---|---|---|
| 1,803,017 | 4/1931 | Hershmann. | |
| 2,588,726 | 3/1952 | Hoover | 317—112 |
| 3,191,100 | 6/1965 | Sorvillo. | |
| 3,212,048 | 10/1965 | Rosenberg | 339—18 |

DARRELL L. CLAY, *Primary Examiner.*